(12) United States Patent
Kondo et al.

(10) Patent No.: US 11,792,917 B2
(45) Date of Patent: Oct. 17, 2023

(54) ELECTRONIC MODULE AND ELECTRONIC APPARATUS

(71) Applicant: CANON KABUSHIKI KAISHA, Tokyo (JP)

(72) Inventors: Takuya Kondo, Kanagawa (JP); Takashi Numagi, Tokyo (JP); Nobuaki Yamashita, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 54 days.

(21) Appl. No.: 17/694,070

(22) Filed: Mar. 14, 2022

(65) Prior Publication Data

US 2022/0304144 A1 Sep. 22, 2022

(30) Foreign Application Priority Data

Mar. 22, 2021 (JP) .................. 2021-046854

(51) Int. Cl.
*H05K 1/02* (2006.01)
*H01L 25/16* (2023.01)
*H05K 1/14* (2006.01)

(52) U.S. Cl.
CPC ......... *H05K 1/0231* (2013.01); *H01L 25/162* (2013.01); *H05K 1/0225* (2013.01); *H05K 1/148* (2013.01); *H05K 2201/09227* (2013.01); *H05K 2201/1003* (2013.01); *H05K 2201/1006* (2013.01); *H05K 2201/10015* (2013.01);
(Continued)

(58) Field of Classification Search
CPC .... H05K 1/0231; H05K 1/0225; H05K 1/148; H05K 2201/09227; H05K 2201/10015; H05K 2201/1003; H05K 2201/1006; H05K 2201/10378; H05K 2201/10545
See application file for complete search history.

(56) References Cited

U.S. PATENT DOCUMENTS 6,518,666 B1 * 2/2003 Ikeda .................. H05K 1/0231
257/738
7,692,300 B2 4/2010 Masanori
(Continued)

FOREIGN PATENT DOCUMENTS

JP 2008-21969 A 1/2008

OTHER PUBLICATIONS

U.S. Appl. No. 17/703,440, filed Mar. 24, 2022 by Nobuaki Yamashita.

*Primary Examiner* — Hoa C Nguyen
(74) *Attorney, Agent, or Firm* — VENABLE LLP

(57) ABSTRACT

An electronic module includes a first semiconductor device disposed on a first main surface of an insulating board of a printed wiring board, a first capacitor disposed on a second main surface of the insulating board at a position that overlaps with the first semiconductor device when viewed in a direction perpendicular to the first main surface, and a second capacitor disposed on the second main surface of the insulating board at a position that overlaps with the first semiconductor device when viewed in the direction perpendicular to the first main surface. A second electrode of the first capacitor is electrically connected to a ground pattern via a first ground via of the printed wiring board. A fourth electrode of the second capacitor is electrically connected to the ground pattern via a second ground via of the printed wiring board.

11 Claims, 6 Drawing Sheets

(52) U.S. Cl.
CPC .............. *H05K 2201/10378* (2013.01); *H05K 2201/10545* (2013.01)

(56) References Cited

U.S. PATENT DOCUMENTS

| | | | |
|---|---|---|---|
| 9,084,364 B2 | 7/2015 | Hoshi et al. | |
| 9,192,044 B2 | 11/2015 | Hayashi et al. | |
| 9,326,370 B2 | 4/2016 | Murai et al. | |
| 9,907,155 B2 | 2/2018 | Numagi et al. | |
| 10,306,761 B2 | 5/2019 | Numagi et al. | |
| 10,716,211 B2 | 7/2020 | Numagi et al. | |
| 2002/0145197 A1* | 10/2002 | Ohta | H05K 1/0231 257/E21.511 |
| 2002/0159243 A1* | 10/2002 | Ogawa | H01L 23/49822 361/780 |
| 2004/0124511 A1* | 7/2004 | Li | H05K 1/0212 257/678 |
| 2008/0258259 A1* | 10/2008 | Osaka | H01L 25/16 257/532 |
| 2010/0300740 A1* | 12/2010 | Ichiyanagi | H01G 4/232 361/321.2 |
| 2013/0265726 A1* | 10/2013 | Murai | H05K 1/025 361/748 |
| 2014/0003012 A1* | 1/2014 | Lee | H05K 1/185 361/763 |
| 2014/0247571 A1* | 9/2014 | Sakai | H05K 1/185 174/251 |
| 2019/0098802 A1* | 3/2019 | Mokler | H05K 9/0028 |
| 2020/0273801 A1* | 8/2020 | Kim | H01L 25/16 |
| 2020/0373285 A1* | 11/2020 | Hovis | H05K 1/0231 |
| 2020/0393787 A1 | 12/2020 | Numagi et al. | |

\* cited by examiner

ELECTRONIC MODULE AND ELECTRONIC APPARATUS

BACKGROUND OF THE INVENTION

Field of the Invention

The present disclosure relates to an electronic module, and an electronic apparatus including the electronic module.

Description of the Related Art

An electronic module disposed in an electronic apparatus includes a printed wiring board, and a semiconductor device mounted on the printed wiring board. One example of the semiconductor device is a semiconductor package. The semiconductor package includes a semiconductor element, and a package board on which the semiconductor element is mounted. When the semiconductor element operates, current caused by the operation of the semiconductor element flows through a power supply path of the package board and the printed wiring board. The impedance of the power supply path is called source impedance. The current that flows through the power supply path and the source impedance causes potential fluctuation, which is expressed as the product of the current and the source impedance. The potential fluctuation is called power-supply potential fluctuation or power supply noise.

Japanese Patent Application Publication No. 2008-21969 describes a technique that reduces the power supply noise. In this technique, a plurality of bypass capacitors is mounted on a back surface of a printed wiring board, which is opposite to a surface of the printed wiring board on which a semiconductor device is mounted.

Some semiconductor devices include a plurality of circuits. In such a semiconductor device, when each circuit is operated, the power supply noise occurs due to the operation of the circuit. If the plurality of bypass capacitors is connected to a common ground, the power supply noise caused by the operation of one of the plurality of circuits may propagate to the other of the plurality of circuits through the ground.

SUMMARY OF THE INVENTION

According to one aspect of the present invention, an electronic module includes a printed wiring board including an insulating board, a first semiconductor device disposed on a first main surface of the insulating board, a first capacitor disposed on a second main surface of the insulating board at a position that overlaps with the first semiconductor device when viewed in a direction perpendicular to the first main surface, and a second capacitor disposed on the second main surface of the insulating board at a position that overlaps with the first semiconductor device when viewed in the direction perpendicular to the first main surface. The second main surface is opposite to the first main surface. The first semiconductor device includes a plurality of terminals including a first power-supply terminal and a second power-supply terminal, a first circuit electrically connected to the first power-supply terminal, and a second circuit electrically connected to the second power-supply terminal. The first capacitor includes a first electrode and a second electrode. The second capacitor includes a third electrode and a fourth electrode. The printed wiring board includes a first power-supply line configured to electrically connect the first power-supply terminal of the first semiconductor device and the first electrode of the first capacitor, a second power-supply line configured to electrically connect the second power-supply terminal of the first semiconductor device and the third electrode of the second capacitor, and a ground line configured to electrically connect the second electrode of the first capacitor and the fourth electrode of the second capacitor. The ground line includes a first ground via, a second ground via, and a ground pattern formed in the insulating board. The second electrode of the first capacitor is electrically connected to the ground pattern via the first ground via. The fourth electrode of the second capacitor is electrically connected to the ground pattern via the second ground via.

Further features of the present invention will become apparent from the following description of exemplary embodiments with reference to the attached drawings.

DESCRIPTION OF THE EMBODIMENTS

Figure 1:
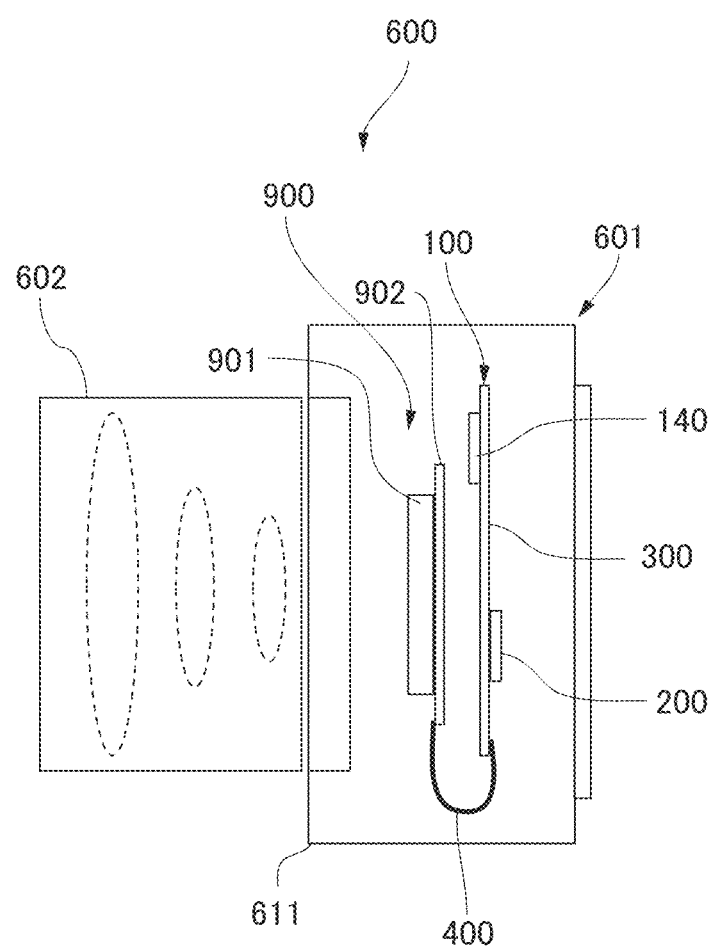
FIG. 1 is a diagram illustrating an electronic apparatus of an embodiment.

Hereinafter, an embodiment of the present invention will be described in detail with reference to the accompanying drawings. FIG. 1 is a diagram illustrating a digital camera 600, which is an image pickup apparatus that is one example of electronic apparatuses of the embodiment. The digital camera 600, which is an image pickup apparatus, is a digital camera with interchangeable lenses; and includes a camera body 601. To the camera body 601, a lens unit (lens barrel) 602 including lenses is detachably attached. The camera body 601 includes a housing 611, a processing module 100, and a sensor module 900. The processing module 100 and the sensor module 900 are disposed in the housing 611. The processing module 100 is one example of electronic modules, and is formed as a printed circuit board. The processing module 100 and the sensor module 900 are electrically connected with each other via a cable 400. In the housing 611, a battery (not illustrated) is disposed.

The sensor module 900 includes an image sensor 901 that is an image pickup element, and a printed wiring board 902. The image sensor 901 is mounted on the printed wiring board 902. The image sensor 901 may be a complementary metal oxide semiconductor (CMOS) image sensor or a charge coupled device (CCD) image sensor. The image sensor 901 has a function that converts the light having passed through the lens unit 602, to an electrical signal.

The processing module 100 includes a semiconductor device 200, a power supply device 140, and a printed wiring board 300. The semiconductor device 200 is one example of a first semiconductor device. The power supply device 140 is one example of a second semiconductor device.

The semiconductor device 200 and the power supply device 140 are mounted on the printed wiring board 300. The printed wiring board 300 is a rigid wiring board. The semiconductor device 200 may be a digital signal processor; and has a function to receive an electrical signal from the image sensor 901, correct the electrical signal, and create image data. The power supply device 140 supplies electric power from the battery (not illustrated) to components of the digital camera 600, which include the semiconductor device 200. The power supply device 140 is an IC that includes power supply elements. The power supply device 140 applies a direct-current voltage to the semiconductor device 200 via the printed wiring board 300, and thereby supplies electric power (i.e., power supply current) to the semiconductor device 200 for operating the semiconductor device 200. In the printed wiring board 300, a power supply path is formed for supplying the electric power (i.e., power supply current) from the power supply device 140 to the semiconductor device 200. The power supply path includes a power supply line and a ground line.

Figure 2:
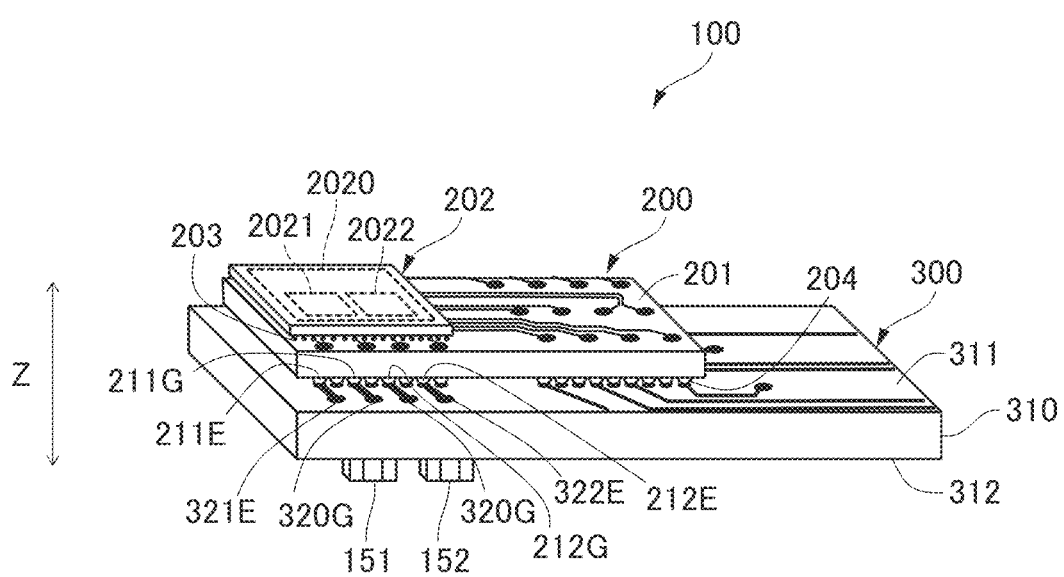
FIG. 2 is a perspective view illustrating one portion of a processing module of the embodiment.

FIG. 2 is a perspective view illustrating one portion of the processing module 100 of the embodiment. The semiconductor device 200 is a semiconductor package. In the present embodiment, the semiconductor device 200 is a ball grid array (BGA) semiconductor package. The semiconductor device 200 includes a package board 201, and a semiconductor element 202 mounted on the package board 201.

The semiconductor element 202 is a semiconductor chip, and includes a die 2020 that is sealed with sealing resin. The die 2020 includes a plurality of core circuits and a plurality of transmitting circuits (buffers). The plurality of core circuits receives a digital signal, and processes the digital signal. The plurality of transmitting circuits transmits a digital signal outputted from the plurality of core circuits, to an external device or another semiconductor device. In the present embodiment, the plurality of transmitting circuits includes a circuit 2021 that is one example of a first circuit, and a circuit 2022 that is one example of a second circuit. The circuit 2021 is a low voltage complementary metal oxide semiconductor (LVCMOS) transmitting circuit, for example. The circuit 2022 is a universal serial bus (USB) transmitting circuit, for example. The power supply current suppled to the circuit 2021 when the circuit 2021 operates is larger than the power supply current supplied to the circuit 2022 when the circuit 2022 operates. Each of the circuits 2021 and 2022 is one of the plurality of transmitting circuits. However, each of the circuits 2021 and 2022 may be one of the plurality of core circuits.

The package board 201 is one example of interposers. The semiconductor element 202 is electrically and mechanically connected to the package board 201 via a plurality of solder bumps 203. The semiconductor device 200 has a plurality of terminals 204, which is disposed on a main surface of the package board 201 (the package board 201 has a pair of main surfaces) opposite to a main surface of the package board 201 on which the semiconductor element 202 is mounted. The package board 201 is electrically and mechanically connected to the printed wiring board 300 via the plurality of terminals 204. For example, each of the terminals 204 is a solder ball. The plurality of terminals 204 is disposed like a lattice.

The processing module 100 includes a plurality of (e.g., two) capacitors 151 and 152 mounted on the printed wiring board 300. The capacitor 151 is one example of a first capacitor, and the capacitor 152 is one example of a second capacitor. The capacitors 151 and 152 are bypass capacitors disposed on the power supply path for reducing the power-supply potential fluctuation, or the power supply noise, produced by the operation of the semiconductor device 200. The capacitors 151 and 152 are disposed between the power supply line and the ground line of the power supply path. That is, one of the electrode pair of each of the capacitors 151 and 152 is electrically connected to the power supply line, and the other is electrically connected to the ground line.

The printed wiring board 300 includes an insulating board 310. The insulating board 310 is formed like a flat board, and includes a pair of main surfaces 311 and 312. The main surface 312 is opposite to the main surface 311. The main surface 311 is one example of a first main surface, and the main surface 312 is one example of a second main surface. In the present embodiment, the semiconductor device 200 is disposed on the main surface 311 of the insulating board 310 of the printed wiring board 300, and the capacitors 151 and 152 are disposed on the main surface 312 of the insulating board 310 of the printed wiring board 300. When viewed in a Z direction, the capacitors 151 and 152 are disposed at positions that overlap with the semiconductor device 200. The Z direction is a direction that is perpendicular to the main surfaces 311 and 312.

Figure 3:
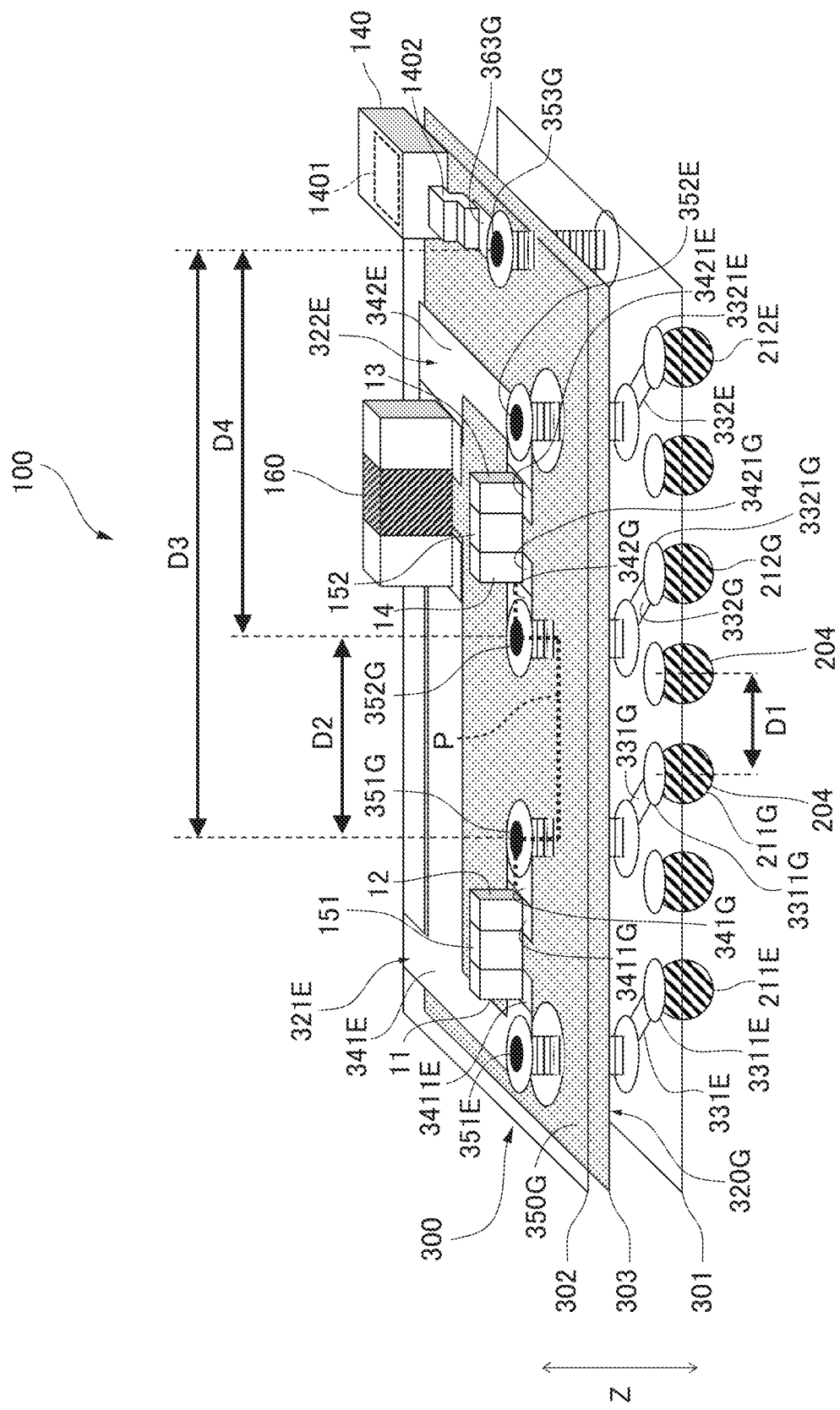
FIG. 3 is a schematic diagram for illustrating a wiring structure of a portion of the processing module of the embodiment, on which capacitors are mounted.

FIG. 3 is a schematic diagram for illustrating a wiring structure of a portion of the processing module 100 of the embodiment, on which the capacitor 151 and 152 are mounted. Note that the insulating board 310 is not illustrated in FIG. 3. The printed wiring board 300 includes a plurality of conductor layers 301, 302, and 303, and solder resist layers (not illustrated). Each of the conductor layers 301 to 303 is a layer on which conductor patterns are formed. The conductor layer 301 is an outer layer, or a surface layer, formed on the main surface 311; and the conductor layer 302 is an outer layer, or a surface layer, formed on the main surface 312. The conductor layer 303 is an inner layer formed in the insulating board 310, that is, between the conductor layer 301 and the conductor layer 302. In each of the conductor layers 301 and 302, the portion of the conductor patterns other than the pads used for solder joint is covered with a solder resist layer. The pads are solder mask defined (SMD) pads or non-solder mask defined (NSMD) pads.

The plurality of terminals 204 include a power supply terminal 211E, a ground terminal 211G, a power supply terminal 212E, and a ground terminal 212G. The power supply terminal 211E is one example of a first power-supply terminal. The ground terminal 211G is one example of a first ground terminal. The power supply terminal 212E is one example of a second power-supply terminal. The ground terminal 212G is one example of a second ground terminal. The power supply terminal 211E is electrically connected to a power supply terminal of the circuit 2021, and the ground terminal 211G is electrically connected to a ground terminal of the circuit 2021. The power supply terminal 212E is electrically connected to a power supply terminal of the circuit 2022, and the ground terminal 212G is electrically connected to a ground terminal of the circuit 2022.

The printed wiring board 300 includes a power supply line 321E that is electrically connected with the power supply terminal 211E, and a power supply line 322E that is electrically connected with the power supply terminal 212E. The power supply line 321E is one example of a first power supply line. The power supply line 322E is one example of a second power supply line. In addition, the printed wiring board 300 includes a ground line 320G that is electrically connected with the ground terminal 211G and the ground terminal 212G. That is, the ground terminals 211G and 212G are electrically connected with each other via the common ground line 320G.

The capacitor 151 has a pair of electrodes 11 and 12. The capacitor 152 has a pair of electrodes 13 and 14. The electrode 11 is one example of a first electrode, and the electrode 12 is one example of a second electrode. The electrode 13 is one example of a third electrode, and the electrode 14 is one example of a fourth electrode.

The power supply terminal 211E of the semiconductor device 200 and the electrode 11 of the capacitor 151 are electrically connected with each other via the power supply line 321E. The power supply terminal 212E of the semiconductor device 200 and the electrode 13 of the capacitor 152 are electrically connected with each other via the power supply line 322E. The ground terminals 211G and 212G of the semiconductor device 200, the electrode 12 of the capacitor 151, and the electrode 14 of the capacitor 152 are electrically connected with each other via the ground line 320G. The power supply lines 321E and 322E and the ground line 320G are the power supply path, via which the power supply device 140 supplies electric power to the semiconductor device 200. Thus, the circuits 2021 and 2022 of the semiconductor element 202 are supplied with the electric power, or the power supply current, by the power supply device 140 via the power supply lines 321E and 322E.

Each of the power supply line 321E, the power supply line 322E, and the ground line 320G is a conductor formed on the insulating board 310 and made of a material such as copper.

The power supply line 321E includes a power supply pattern 331E formed in the conductor layer 301, a power supply pattern 341E formed in the conductor layer 302, and a power supply via 351E formed in contact with the power supply pattern 331E and the power supply pattern 341E.

The power supply via 351E is a via conductor that connects the power supply pattern 331E and the power supply pattern 341E. The power supply pattern 331E has a pad 3311E, which is joined with the power supply terminal 211E. The power supply pattern 341E has a pad 3411E, which is joined with the electrode 11 of the capacitor 151.

The power supply line 322E includes a power supply pattern 332E formed in the conductor layer 301, a power supply pattern 342E formed in the conductor layer 302, and a power supply via 352E formed in contact with the power supply pattern 332E and the power supply pattern 342E.

The power supply via 352E is a via conductor that connects the power supply pattern 332E and the power supply pattern 342E. The power supply pattern 332E has a pad 3321E, which is joined with the power supply terminal 212E. The power supply pattern 342E has a pad 3421E, which is joined with the electrode 13 of the capacitor 152.

The ground line 320G includes a ground pattern 331G formed in the conductor layer 301, and a ground pattern 332G formed in the conductor layer 301. The ground line 320G also includes a ground pattern 341G formed in the conductor layer 302, and a ground pattern 342G formed in the conductor layer 302. The ground line 320G also includes a ground via 351G formed in contact with the ground pattern 331G and the ground pattern 341G. The ground line 320G also includes a ground via 352G formed in contact with the ground pattern 332G and the ground pattern 342G. The ground via 351G is one example of a first ground via, and the ground via 352G is one example of a second ground via.

The ground via 351G is a via conductor that connects the ground pattern 331G and the ground pattern 341G. The ground pattern 331G has a pad 3311G, which is joined with the ground terminal 211G. The ground pattern 341G has a pad 3411G, which is joined with the electrode 12 of the capacitor 151.

The ground via 352G is a via conductor that connects the ground pattern 332G and the ground pattern 342G. The ground pattern 332G has a pad 3321G, which is joined with the ground terminal 212G. The ground pattern 342G has a pad 3421G, which is joined with the electrode 14 of the capacitor 152.

The power supply via 351E is disposed close to the capacitor 151. In the present embodiment, the power supply via 351E is disposed closer to the capacitor 151 than to the capacitor 152 and the power supply device 140.

The power supply via 352E is disposed close to the capacitor 152. In the present embodiment, the power supply via 352E is disposed closer to the capacitor 152 than to the capacitor 151 and the power supply device 140.

The ground via 351G is disposed close to the capacitor 151. In the present embodiment, the ground via 351G is disposed closer to the capacitor 151 than to the capacitor 152 and the power supply device 140.

The ground via 352G is disposed close to the capacitor 152. In the present embodiment, the ground via 352G is disposed closer to the capacitor 152 than to the capacitor 151 and the power supply device 140.

The power supply device 140 includes a power supply circuit 1401, a power supply terminal (not illustrated), and a ground terminal 1402. The power supply terminal (not illustrated) and the ground terminal 1402 are electrically connected to the power supply circuit 1401. The power supply terminal (not illustrated) of the power supply device 140 is electrically connected to the power supply line 321E. The ground terminal 1402 of the power supply device 140 is electrically connected to the ground line 320G. The power supply circuit 1401 is one example of a third circuit. The power supply circuit 1401 is a circuit that supplies electric power to the circuits 2021 and 2022.

The ground line 320G includes a ground pattern 363G formed in the conductor layer 302, and a ground via 353G disposed close to the power supply device 140. The ground via 353G is one example of a third ground via. In the present embodiment, the ground via 353G is disposed closer to the power supply device 140 than to the capacitors 151 and 152. The pad of the ground pattern 363G is joined with the ground terminal 1402 of the power supply device 140. The ground pattern 363G is in contact with the ground via 353G, so that the ground pattern 363G is connected to the ground via 353G.

The power supply line 321E and the power supply line 322E are electrically connected with each other via a low-pass-filer component, or a ferrite bead 160 in the present embodiment. The ferrite bead 160 is one example of electric components.

Thus, the power supply terminal of the power supply device 140 is electrically connected to the power supply terminals 211E and 212E of the semiconductor device 200, the electrode 11 of the capacitor 151, and the electrode 13 of the capacitor 152, via the power supply lines 321E and 322E and the ferrite bead 160. In addition, the ground terminal 1402 of the power supply device 140 is electrically connected to the ground terminals 211G and 212G of the semiconductor device 200, the electrode 12 of the capacitor 151, and the electrode 14 of the capacitor 152, via the ground line 320G.

Figure 4:
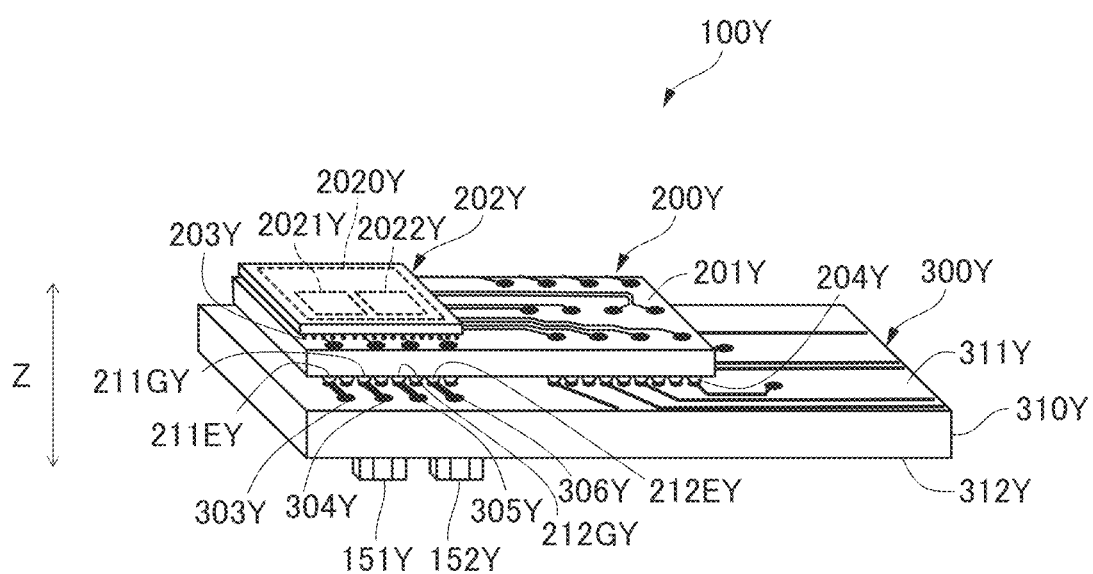
FIG. 4 is a perspective view illustrating one portion of a processing module of a comparative example.

Next, a processing module of a comparative example will be described. FIG. 4 is a perspective view illustrating one portion of a processing module 100Y of the comparative example. The processing module 100Y includes a printed wiring board 300Y, and a semiconductor device 200Y mounted on the printed wiring board 300Y. The semiconductor device 200Y is a semiconductor package; and includes a package board 201Y, and a semiconductor element 202Y mounted on the package board 201Y. The semiconductor element 202Y is a semiconductor chip, and includes a die 2020Y that is sealed with sealing resin. The die 2020Y includes a circuit 2021Y and a circuit 2022Y. The power supply current suppled to the circuit 2021Y when the circuit 2021Y operates is larger than the power supply current supplied to the circuit 2022Y when the circuit 2022Y operates.

The semiconductor element 202Y is electrically and mechanically connected to the package board 201Y via a plurality of solder bumps 203Y The package board 201Y of the semiconductor device 200Y is electrically and mechanically connected to the printed wiring board 300Y via a plurality of terminals 204Y. For example, each of the terminals 204Y is a solder ball. The plurality of terminals 204Y is disposed like a lattice.

The processing module 100Y includes two capacitors 151Y and 152Y mounted on the printed wiring board 300Y. Each of the capacitors 151Y and 152Y is a bypass capacitor.

The printed wiring board 300Y includes an insulating board 310Y. The insulating board 310Y includes a pair of main surfaces 311Y and 312Y. The semiconductor device 200Y is disposed on the main surface 311Y of the insulating board 310Y, and the capacitors 151Y and 152Y are disposed on the main surface 312Y of the insulating board 310Y. When viewed in the Z direction, the capacitors 151Y and 152Y are disposed at positions that overlap with the semiconductor device 200Y.

Figure 5:
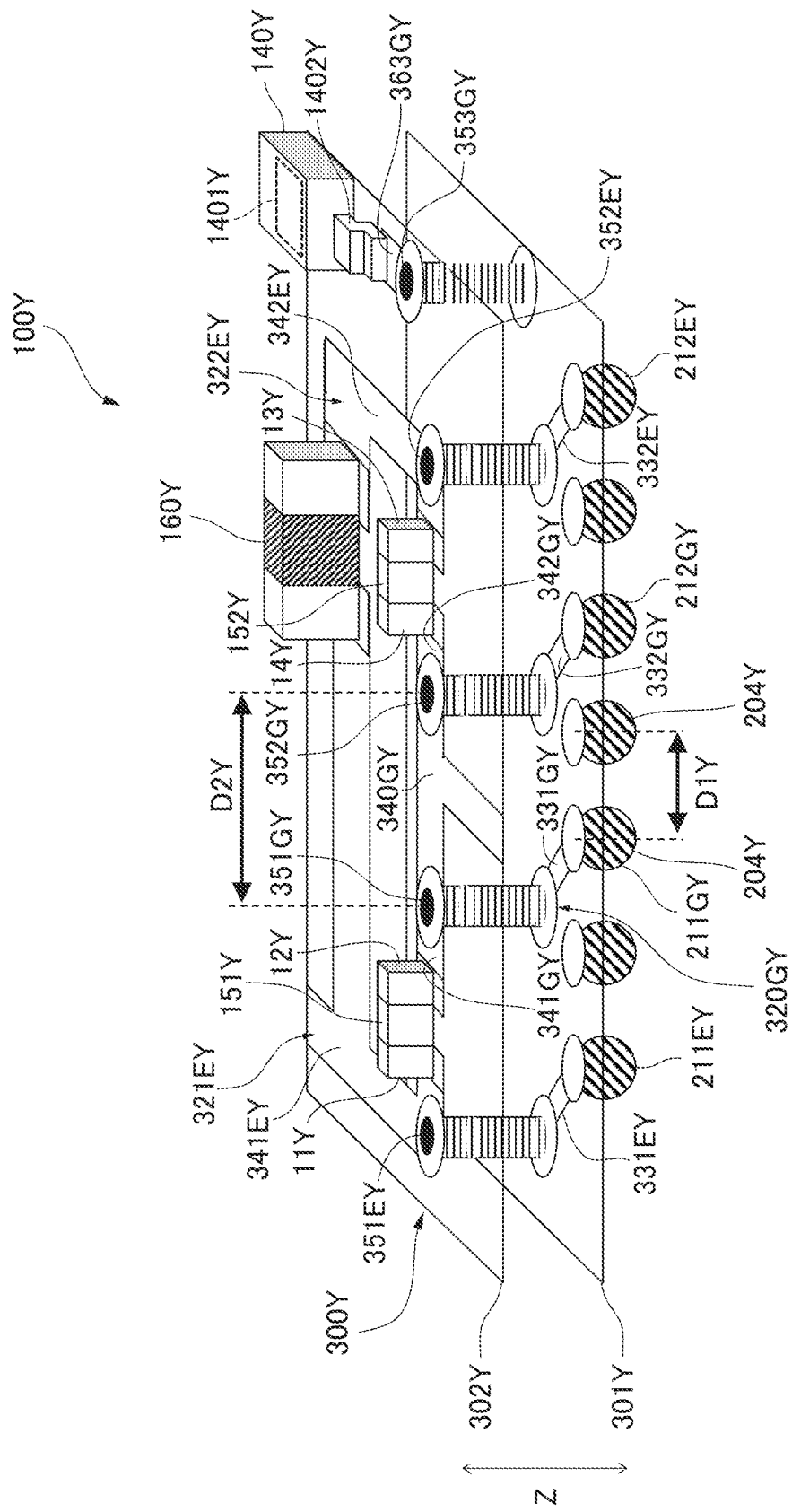
FIG. 5 is a schematic diagram for illustrating a wiring structure of a portion of the processing module of the comparative example, on which capacitors are mounted.

FIG. 5 is a schematic diagram for illustrating a wiring structure of a portion of the processing module 100Y of the comparative example, on which the capacitors 151Y and 152Y are mounted. The processing module 100Y includes a power supply device 140Y mounted on the printed wiring board 300Y. The printed wiring board 300Y includes a plurality of conductor layers 301Y and 302Y, and solder resist layers (not illustrated). The conductor layer 301Y is an outer layer, or a surface layer, formed on the main surface 311Y; and the conductor layer 302Y is an outer layer, or a surface layer, formed on the main surface 312Y. The plurality of terminals 204Y of the semiconductor device 200Y include a power supply terminal 211EY, a ground terminal 211GY, a power supply terminal 212EY, and a ground terminal 212GY. The power supply terminal 211EY is electrically connected to a power supply terminal of the circuit 2021Y, and the ground terminal 211GY is electrically connected to a ground terminal of the circuit 2021Y. The power supply terminal 212EY is electrically connected to a power supply terminal of the circuit 2022Y, and the ground terminal 212GY is electrically connected to a ground terminal of the circuit 2022Y.

The printed wiring board 300Y includes a power supply line 321EY that is electrically connected with the power supply terminal 211EY, and a power supply line 322EY that is electrically connected with the power supply terminal 212EY. In addition, the printed wiring board 300Y includes a ground line 320GY that is electrically connected with the ground terminal 211GY and the ground terminal 212GY. That is, the ground terminals 211GY and 212GY are electrically connected with each other via the common ground line 320GY.

The capacitor 151Y has a pair of electrodes 11Y and 12Y. The capacitor 152Y has a pair of electrodes 13Y and 14Y. The power supply terminal 211EY of the semiconductor device 200Y and the electrode 11Y of the capacitor 151Y are electrically connected with each other via the power supply line 321EY. The power supply terminal 212EY of the semiconductor device 200Y and the electrode 13Y of the capacitor 152Y are electrically connected with each other via the power supply line 322EY. The ground terminals 211GY and 212GY of the semiconductor device 200Y, the electrode 12Y of the capacitor 151Y, and the electrode 14Y of the capacitor 152Y are electrically connected with each other via the ground line 320GY. The power supply device 140Y supplies electric power, or power supply current, to the circuits 2021Y and 2022Y of the semiconductor element 202Y via the power supply lines 321EY and 322EY.

The power supply line 321EY includes a power supply pattern 331EY formed in the conductor layer 301Y, a power supply pattern 341EY formed in the conductor layer 302Y, and a power supply via 351EY formed in contact with the power supply pattern 331EY and the power supply pattern 341EY.

The power supply via 351EY is a via conductor that connects the power supply pattern 331EY and the power supply pattern 341EY. The pad of the power supply pattern 331EY is joined with the power supply terminal 211EY. The pad of the power supply pattern 341EY is joined with the electrode 11Y of the capacitor 151Y.

The power supply line 322EY includes a power supply pattern 332EY formed in the conductor layer 301Y, a power supply pattern 342EY formed in the conductor layer 302Y, and a power supply via 352EY formed in contact with the power supply pattern 332EY and the power supply pattern 342EY.

The power supply via 352EY is a via conductor that connects the power supply pattern 332EY and the power supply pattern 342EY. The pad of the power supply pattern 332EY is joined with the power supply terminal 212EY. The pad of the power supply pattern 342EY is joined with the electrode 13Y of the capacitor 152Y.

The ground line 320GY includes a ground pattern 331GY formed in the conductor layer 301Y, and a ground pattern 332GY formed in the conductor layer 301Y. The ground line 320GY also includes a ground pattern 341GY formed in the conductor layer 302Y, and a ground pattern 342GY formed in the conductor layer 302Y. The ground line 320GY also includes a ground via 351GY formed in contact with the ground pattern 331GY and the ground pattern 341GY. The ground line 320GY also includes a ground via 352GY formed in contact with the ground pattern 332GY and the ground pattern 342GY.

The ground via 351GY is a via conductor that connects the ground pattern 331GY and the ground pattern 341GY. The pad of the ground pattern 331GY is joined with the ground terminal 211GY. The pad of the ground pattern 341GY is joined with the electrode 12Y of the capacitor 151Y.

The ground via 352GY is a via conductor that connects the ground pattern 332GY and the ground pattern 342GY. The pad of the ground pattern 332GY is joined with the ground terminal 212GY. The pad of the ground pattern 342GY is joined with the electrode 14Y of the capacitor 152Y.

The power supply device 140Y includes a power supply circuit 1401Y, a power supply terminal (not illustrated), and a ground terminal 1402Y. The power supply terminal (not illustrated) and the ground terminal 1402Y are electrically connected to the power supply circuit 1401Y. The power supply terminal (not illustrated) of the power supply device 140Y is electrically connected to the power supply line 321EY. The ground terminal 1402Y of the power supply device 140Y is electrically connected to the ground line 320GY.

The ground line 320GY includes a ground pattern 363GY formed in the conductor layer 302Y, and a ground via 353GY. The pad of the ground pattern 363GY is joined with the ground terminal 1402Y of the power supply device 140Y. The ground pattern 363GY is in contact with the ground via 353GY, so that the ground pattern 363GY is connected to the ground via 353GY.

The power supply line 321EY and the power supply line 322EY are electrically connected with each other via a ferrite bead 160Y.

In the comparative example, the ground line 320GY includes a ground pattern 340GY formed in the conductor layer 302Y and connecting the ground via 351GY and the ground via 352GY. The ground pattern 340GY serves also as a conductor pattern that connects the ground pattern 341GY and the ground pattern 342GY in the conductor layer 302Y. The width of the ground pattern 340GY is larger than the diameter of each of the ground via 351GY and the ground via 352GY. In addition, the width of the ground pattern 340GY is equal to or larger than the diameter of via pads of each of the ground via 351GY and the ground via 352GY. Thus, in the comparative example, the shortest conduction path between the electrode 12Y of the capacitor 151Y and the electrode 14Y of the capacitor 152Y is constituted by the ground pattern 341GY, the wide ground pattern 340GY, and the ground pattern 342GY.

The circuit 2021Y is supplied with electric power, or power supply current, from the power supply device 140Y via the power supply line 321EY. When the circuit 2021Y operates, the power-supply potential fluctuation, or the power supply noise, occurs in the circuit 2021Y, depending on the operation of the circuit 2021Y. The power-supply potential fluctuation in the circuit 2021Y is reduced by the capacitor 151Y disposed between the power supply via 351EY and the ground via 351GY and supplying electric charge to the circuit 2021Y. When the capacitor 151Y supplies the electric charge to the circuit 2021Y, power-supply potential fluctuation is produced between the electrode 11Y and the electrode 12Y of the capacitor 151Y, in accordance with the inductance of a line extending from the capacitor 151Y to the circuit 2021Y.

The power-supply potential fluctuation produced between the electrode 11Y and the electrode 12Y of the capacitor 151Y causes potential fluctuation on the ground line 320GY. The present inventors have found that the potential fluctuation propagates to the capacitor 152Y through the ground pattern 340GY and causes power-supply potential fluctuation between the electrode 13Y and the electrode 14Y of the capacitor 152Y. The power-supply potential fluctuation that has propagated to the capacitor 152Y propagates to the circuit 2022Y, possibly causing unstable operation of the circuit 2022Y.

The same holds true for the power-supply potential fluctuation caused by the operation of the circuit 2022Y. However, the value of power supply current supplied to the circuit 2022Y when the circuit 2022Y operates is smaller than the value of power supply current supplied to the circuit 2021Y when the circuit 2021Y operates. Thus, the power-supply potential fluctuation caused by the operation of the circuit 2022Y is smaller than the power-supply potential fluctuation caused by the operation of the circuit 2021Y.

Since the circuit 2022Y has a relatively small value of operating current, the circuit 2022Y has a relatively small allowable value of power-supply potential fluctuation. For a circuit such as the circuit 2022Y, the ferrite bead 160Y is suitably disposed on the printed wiring board 300Y for suppressing the power supply noise from flowing from the other power supply line 321EY into the circuit 2022Y. Thus, in the comparative example, the power supply noise is suppressed by the ferrite bead 160Y, from flowing from the power supply line 321EY into the power supply line 322EY.

As described above, however, since the capacitor 151Y, which serves as an electric-charge supply source, supplies the electric charge to the circuit 2021Y, the potential fluctuation occurs between the electrode 11Y and the electrode 12Y. The electrode 12Y of the capacitor 151Y is electrically connected to the ground terminal 1402Y of the power supply device 140Y, via the ground pattern 340GY. Thus, potential fluctuation occurs on the ground pattern 340GY, in accordance with the impedance of the ground pattern 340GY. As a result, potential fluctuation occurs between a power supply pad and a ground pad of the circuit 2022Y, via the capacitor 152Y connected to the ground pattern 340GY.

For this reason, in the present embodiment, the impedance of a wiring structure between the electrode 12 of the capacitor 151 and the electrode 14 of the capacitor 152 of the printed wiring board 300 is controlled for reducing the power supply noise from propagating from the circuit 2021 to the circuit 2022.

As illustrated in FIG. 3, the ground line 320G includes a ground pattern 350G formed in the conductor layer 303, which is formed in the insulating board 310 (FIG. 2). The ground pattern 350G is a solid conductor pattern formed in almost all the conductor layer 303. The ground pattern 350G is in contact with the ground via 351G, the ground via 352G, and the ground via 353G in the conductor layer 303, so that the ground pattern 350G is connected to the ground via 351G, the ground via 352G, and the ground via 353G. Thus, the electrode 12 of the capacitor 151 is electrically connected with the ground pattern 350G via the ground via 351G, and the electrode 14 of the capacitor 152 is electrically connected with the ground pattern 350G via the ground via 352G.

In the present embodiment, the ground line 320G does not include a conductor pattern that directly connects the ground via 351G and the ground via 352G in the conductor layer 302. That is, the ground line 320G does not include the ground pattern 340GY of the comparative example, which is illustrated in FIG. 5. In other words, in the conductor layer 302, the ground pattern 341G is not electrically connected with the ground pattern 342G via a conductor pattern such as the ground pattern 340GY. Since the ground pattern 340GY is not formed in the present embodiment, the ground pattern 350G is included in a shortest conduction path P between the electrode 12 of the capacitor 151 and the electrode 14 of the capacitor 152. The shortest path P includes a portion of the ground via 351G between the conductor layer 302 and the conductor layer 303 and a portion of the ground via 352G between the conductor layer 302 and the conductor layer 303. That is, the electrode 12 of the capacitor 151 is electrically connected with the electrode 14 of the capacitor 152 via the ground pattern 350G of the conductor layer 303. Thus, since the shortest path P is formed through the ground pattern 350G, the shortest path P is longer than the distance in a straight line between the ground via 351G and the ground via 352G. As a result, the impedance value of the line between the electrode 12 of the capacitor 151 and the electrode 14 of the capacitor 152 increases in a high-frequency band in which the voltage level of the power supply noise increases. Consequently, the power supply noise is reduced from propagating from the circuit 2021 to the circuit 2022 via the capacitors 151 and 152. Therefore, the circuit 2022 operates more stably.

Preferably, when viewed in the Z direction, a center-to-center distance D2 between the ground via 351G and the ground via 352G is equal to or smaller than the double of a center-to-center distance D1 between two adjacent terminals of the plurality of terminals 204. Note that the center of each of the ground vias 351G, 352G, and 353G is the center of the circle of each of the ground vias 351G, 352G, and 353G as viewed in the Z direction. The center-to-center distance D2 is a distance between a center line extending in the Z direction through the center of the ground via 351G viewed in the Z direction and a center line extending in the Z direction through the center of the ground via 352G viewed in the Z direction. Similarly, the center of each of the terminals 204 is the center of the circle of each of the terminals 204 as viewed in the Z direction. The center-to-center distance D1 is a distance between two center lines, each extending in the Z direction though the center of a corresponding one of the two terminals 204 viewed in the Z direction. If the center-to-center distance D2 is equal to or smaller than the double of the center-to-center distance D1, the power supply noise can be effectively reduced from propagating from the circuit 2021 to the circuit 2022 in a case where high-density wiring is achieved in the printed wiring board 300.

For achieving the high-density wiring, it is preferable that the center-to-center distance D2 be equal to or smaller than the center-to-center distance D1 when viewed in the Z direction. Hereinafter, the description will be made with reference to FIG. 3 of the present embodiment and FIG. 5 of the comparative example. An amount of noise that propagates from the capacitor 151 to the capacitor 152 in a case where the center-to-center distance D2 is equal to or smaller than the center-to-center distance D1 is denoted by V1. In addition, an amount of noise that propagates from the capacitor 151Y to the capacitor 152Y in a case where a center-to-center distance D2Y is equal to or smaller than a center-to-center distance D1Y is denoted by V1Y. The center-to-center distance D2Y is a distance between the ground via 351GY and the ground via 352GY, and the center-to-center distance D1Y is a distance between two adjacent terminals 204Y. In addition, an amount of noise that propagates from the capacitor 151 to the capacitor 152 in a case where the center-to-center distance D2 is larger than the center-to-center distance D1 and equal to or smaller than the double of the center-to-center distance D1 is denoted by V2. In addition, an amount of noise that propagates from the capacitor 151Y to the capacitor 152Y in a case where the center-to-center distance D2Y is larger than the center-to-center distance D1Y and equal to or smaller than the double of the center-to-center distance DIN is denoted by V2Y. The ratio V1/V1Y of the amount of noise V1 to the amount of noise V1Y is smaller than the ratio V2/V2Y of the amount of noise V2 to the amount of noise V2Y. That is, if the center-to-center distance D2 is equal to or smaller than the center-to-center distance D1, the power supply noise that propagates from the capacitor 151 to the capacitor 152 is effectively reduced. Thus, in the present embodiment, the power supply noise that propagates from the circuit 2021 to the circuit 2022 can be effectively reduced in a case where the high-density wiring is achieved in the printed wiring board 300.

EXAMPLE

Hereinafter, experimental results in Example 1 and Comparative Example 1 will be described. Example 1 is a specific example of the above-described embodiment. Comparative Example 1 is a specific example of the above-described comparative example.

Example 1

The thickness of the printed wiring board 300 was set at 1.2 mm. The thickness of each of the conductor layers 301 and 302 of the printed wiring board 300 was set at 0.0043 mm. The thickness of the conductor layer 303 was set at 0.0035 mm. The thickness of the dielectric layer between the conductor layers 301 and 303 of the insulating board 310 was set at 0.1 mm. The center-to-center distance D1 between two terminals 204 of the semiconductor device 200 was set at 0.8 mm. The diameter of each of the via 351E, the via 352E, the via 351G, the via 352G, and the via 353G was set at 0.25 mm. The diameter of via pads of each of the via 351E, the via 352E, the via 351G, the via 352G, and the via 353G was set at 0.5 mm. The via pads were formed in the conductor layer 301 and the conductor layer 302. The center-to-center distance D2 was set equal to or smaller than the double of the center-to-center distance D1. Specifically, the center-to-center distance D2 was set at 1.6 mm.

The ground terminal 1402 of the power supply device 140 is electrically connected to the ground pattern 350G via the ground via 353G. A center-to-center distance D3 between the ground via 351G and the ground via 353G, viewed in the Z direction, was set longer than 1.6 mm. Specifically, the center-to-center distance D3 was set at 100 mm or more. In addition, a center-to-center distance D4 between the ground via 352G and the ground via 353G, viewed in the Z direction, was set longer than 1.6 mm. Specifically, the center-to-center distance D4 was set at 100 mm or more. Therefore, the center-to-center distance D2 is smaller than each of the center-to-center distance D3 and the center-to-center distance D4.

The center-to-center distance D3 is a distance between a center line extending in the Z direction through the center of the ground via 351G viewed in the Z direction and a center line extending in the Z direction through the center of the ground via 353G viewed in the Z direction. The center-to-center distance D4 is a distance between a center line extending in the Z direction through the center of the ground via 352G viewed in the Z direction and the center line extending in the Z direction through the center of the ground via 353G viewed in the Z direction. The line width of each of the power supply patterns 341E and 342E was set at 0.38 mm. Each of the capacitors 151 and 152 used was a chip component with the 0.6 mm×0.3 mm size. The nominal capacitance (rated capacity) of each of the capacitors 151 and 152 used was 1 µF. The ferrite bead 160 used was a chip component with the 1.0 mm×0.5 mm size. The impedance value of the ferrite bead 160 used was 120Ω at 100 MHz.

Comparative Example 1

The center-to-center distance D1Y between two adjacent terminals of the plurality of terminals 204Y was set at 0.8 mm. The center-to-center distance D2Y between the ground via 351GY and the ground via 352GY was set at 1.6 mm.

Each of the capacitors 151Y and 152Y used was a chip component with the 0.6 mm×0.3 mm size. The ferrite bead 160Y used was a chip component with the 1.0 mm×0.5 mm size.

The thickness of the printed wiring board 300Y was set at 1.2 mm. The diameter of each of the via 351EY, the via 351GY, the via 352EY, the via 352GY, and the via 353GY was set at 0.25 mm. The nominal capacitance of each of the capacitors 151Y and 152Y used was 1 µF. The impedance value of the ferrite bead 160Y used was 120Ω at 100 MHz.

In the above-described configurations, transfer impedance characteristics (Z21) were measured in Example 1 and Comparative Example 1. In Example 1, the transfer impedance characteristic was measured between power supply and ground pads of the circuit 2021 and power supply and ground pads of the circuit 2022. In Comparative Example 1, the transfer impedance characteristic was measured between power supply and ground pads of the circuit 2021Y, and power supply and ground pads of the circuit 2022Y.

Figure 6A:
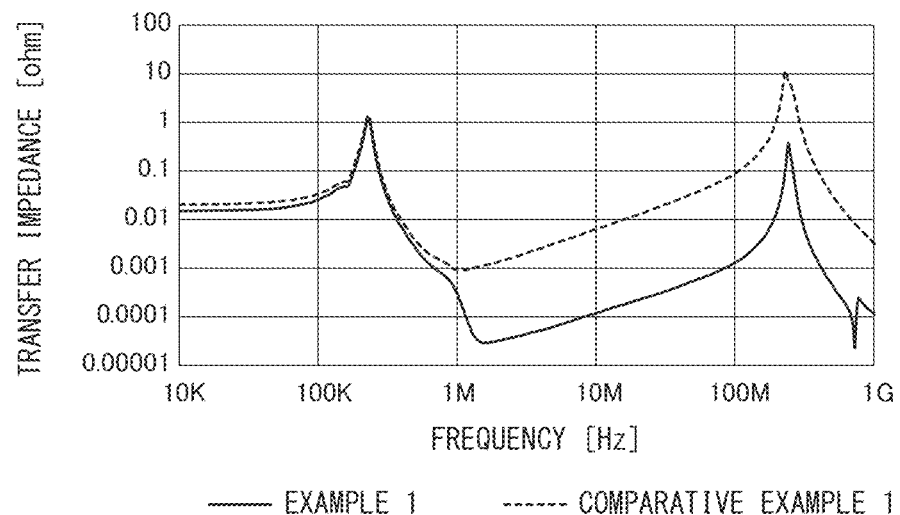
FIG. 6A is a graph of transfer impedance characteristics obtained in Example 1 and Comparative Example 1.

FIG. 6A is a graph of the transfer impedance characteristics obtained in Example 1 and Comparative Example 1. The transfer impedance characteristic represents the amount of noise that propagates from one circuit to another circuit when the power supply current flows in the one circuit. A solid line indicates the result in Example 1, and a broken line indicates the result in Comparative Example 1 in FIG. 6A. Note that the operating currents of the circuits 2021, 2022, 2021Y, and 2022Y were set at the same value.

In each of Example 1 and Comparative Example 1, a propagation noise voltage V21 measured at the circuit 2022 or 2022Y is expressed by the following equation (1):

$$V21 = I1 \times Z21 \qquad (1)$$

where I1 is the operating current of the circuits 2021 and 2021Y.

Figure 6B:
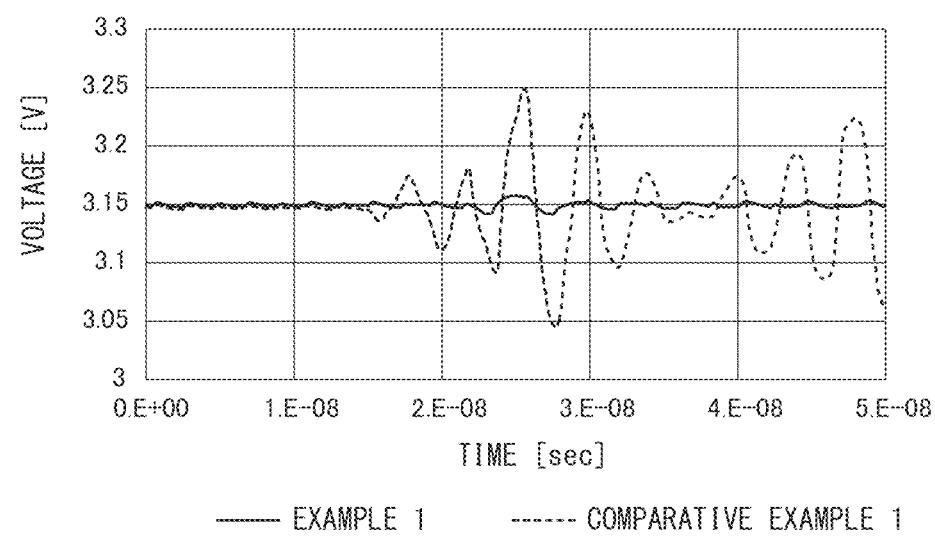
FIG. 6B is a graph illustrating waveforms of power-supply potential fluctuation observed in Example 1 and Comparative Example 1.

FIG. 6B is a graph illustrating waveforms of the power-supply potential fluctuation observed in Example 1 and Comparative Example 1 in FIG. 6B. A solid line indicates the result in Example 1, and a broken line indicates the result in Comparative Example 1. A waveform of the power-supply potential fluctuation measured, in Example 1, between a power supply pad and a ground pad of the circuit 2022 when the circuits 2021 and 2022 were operated is illustrated in FIG. 6B. In addition, a waveform of the power-supply potential fluctuation measured, in Comparative Example 1, between a power supply pad and a ground pad of the circuit 2022Y when the circuits 2021Y and 2022Y were operated is illustrated in FIG. 6B.

The operating current of the circuit 2021Y momentarily increases to a value that is about 100 times larger than the operating current of the circuit 2022Y. The amplitude of the power-supply potential fluctuation was about 230 mV in Comparative Example 1. The allowable value of power-supply potential fluctuation of the circuits 2022 and 2022Y is 50 mV. Thus, the amplitude of the power-supply potential fluctuation of Comparative Example 1 exceeds the allowable value.

In Example 1, as illustrated in FIG. 6A, the transfer impedance is lower than the transfer impedance of Comparative Example 1. In particular, in a frequency band higher than 1 MHz, the transfer impedance is equal to or smaller than one tenth of the transfer impedance of Comparative Example 1. In Example 1, the ground pattern 350G with a low impedance is interposed in the conduction path formed from the electrode 12 of the capacitor 151 to the electrode 14 of the capacitor 152. Thus, in Example 1, the power-supply potential fluctuation produced in the capacitor 151 is reduced from propagating to the capacitor 152.

In addition, as illustrated in FIG. 6B, the power-supply potential fluctuation in Example 1 is smaller than the power-supply potential fluctuation in Comparative Example 1. Specifically, the amplitude of the power-supply potential fluctuation measured between a power supply pad and a ground pad of the circuit 2022 of Example 1 was 16 mV. Thus, the power-supply potential fluctuation measured between the power supply pad and the ground pad of the circuit 2022 of Example 1 is equal to or smaller than one tenth of the power-supply potential fluctuation measured between the power supply pad and the ground pad of the circuit 2022Y of Comparative Example 1.

The present invention is not limited to the above-described embodiment, and can be variously modified within a technical spirit of the present invention. In addition, the effects described in the embodiment are merely examples of the most suitable effects produced by the present invention. Thus, the effects of the present invention are not limited to the effects described in the embodiment.

In the above-described embodiment, the description has been made for the case where the power supply line 321E and the power supply line 322E are electrically connected with each other via the ferrite bead 160. However, the present disclosure is not limited to this. For example, a low-pass-filer component, such as an inductor, may be disposed in place of the ferrite bead 160. In another case, if the voltage applied to the power supply line 321E and the voltage applied to the power supply line 322E are different from each other, the electric component such as the ferrite bead 160 may not be disposed, and the power supply line 321E and the power supply line 322E may be electrically separated from each other.

In addition, although the description has been made in the above-described embodiment for the case where the ground via 353G is disposed, the ground via 353G may not be disposed.

In addition, although the description has been made in the above-described embodiment for the case where the ground via 351G and the ground via 352G are not connected with each other in the conductor layer 302 of the printed wiring board 300, the present disclosure is not limited to this. For example, the ground via 351G and the ground via 352G may be connected with each other in the conductor layer 302 via a conductor that has a width equal to or smaller than the diameter of the ground via 351G and the ground via 352G. In this case, it is more preferable that the ground via 351G and the ground via 352G be connected with each other in the conductor layer 302 via a conductor that has a width smaller than the diameter of the via pads of the ground via 351G and the ground via 352G. In another case, the ground via 351G and the ground via 352G may be electrically connected with each other via an electric component, such as a resistive component or a ferrite bead. In this case, it is preferable that the electric component have high impedance in a frequency band in which the power supply noise has high voltage level.

In addition, although the description has been made in the above-described embodiment for the case where the semiconductor element 202 and the package board 201 are connected with each other via solder bumps 203, the present disclosure is not limited to this. For example, the semiconductor element 202 and the package board 201 may be connected with each other by using another connection method, such as wire bonding.

In addition, although the description has been made in the above-described embodiment for the case where the single capacitor 151 is mounted on the printed wiring board 300 for the circuit 2021 and the single capacitor 152 is mounted on the printed wiring board 300 for the circuit 2022, the present disclosure is not limited to this. For example, a plurality of capacitors may be mounted on the printed wiring board 300 for the circuit 2021, and a plurality of capacitors may be mounted on the printed wiring board 300 for the circuit 2022.

In addition, although the description has been made in the above-described embodiment for the case where the power supply device 140 is mounted on the printed wiring board 300, the present disclosure is not limited to this. Since the power supply device 140 has only to supply the electric power to the semiconductor device 200 via the printed wiring board 300, the power supply device 140 may be mounted on another wiring board that is electrically connected with the printed wiring board 300. In this case, the ground terminal 1402 of the power supply device 140 has only to be electrically connected to the ground line 320G.

In addition, although the description has been made in the above-described embodiment for the case where the electronic module of the present invention is applied to an image pickup apparatus, such as a digital camera, which is an electronic apparatus, the present disclosure is not limited to this. The electronic module of the present invention may be applied to other electronic apparatuses, such as mobile apparatuses, car-mounted apparatuses, and image-forming apparatuses. Examples of the image-forming apparatuses include printers, copying machines, facsimiles, and multi-function products that have these functions.

As described above, in the above-described embodiment, the power supply noise can be reduced from propagating.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-46854, filed Mar. 22, 2021, which is hereby incorporated by reference herein in its entirety.

What is claimed is:

1. An electronic module comprising:
a printed wiring board including an insulating board;
a first semiconductor device disposed on a first main surface of the insulating board;
a first capacitor disposed on a second main surface of the insulating board at a position that overlaps with the first semiconductor device when viewed in a direction perpendicular to the first main surface, the second main surface being opposite to the first main surface; and
a second capacitor disposed on the second main surface of the insulating board at a position that overlaps with the first semiconductor device when viewed in the direction perpendicular to the first main surface,
wherein the first semiconductor device includes a plurality of terminals including a first power-supply terminal and a second power-supply terminal, a first circuit electrically connected to the first power-supply terminal, and a second circuit electrically connected to the second power-supply terminal,
wherein the first capacitor includes a first electrode and a second electrode,
wherein the second capacitor includes a third electrode and a fourth electrode,
wherein the printed wiring board includes
a first power-supply line configured to electrically connect the first power-supply terminal of the first semiconductor device and the first electrode of the first capacitor,
a second power-supply line configured to electrically connect the second power-supply terminal of the first semiconductor device and the third electrode of the second capacitor, and
a ground line configured to electrically connect the second electrode of the first capacitor and the fourth electrode of the second capacitor,
wherein the ground line includes a first ground via, a second ground via, and a ground pattern formed in the insulating board,
wherein the second electrode of the first capacitor is electrically connected to the ground pattern via the first ground via, and
wherein the fourth electrode of the second capacitor is electrically connected to the ground pattern via the second ground via.

2. The electronic module according to claim 1, wherein a center-to-center distance between the first ground via and the second ground via, viewed in the direction perpendicular to the first main surface, is equal to or smaller than double of a center-to-center distance between two adjacent terminals of the plurality of terminals.

3. The electronic module according to claim 1, wherein a center-to-center distance between the first ground via and the second ground via, viewed in the direction perpendicular to the first main surface, is equal to or smaller than a center-to-center distance between two adjacent terminals of the plurality of terminals.

4. The electronic module according to claim 1, wherein the plurality of terminals include a first ground terminal electrically connected to the first circuit and a second ground terminal electrically connected to the second circuit, and
wherein the first ground terminal and the second ground terminal are electrically connected to the ground line.

5. The electronic module according to claim 1, wherein the ground pattern is included in a shortest conduction path between the second electrode of the first capacitor and the fourth electrode of the second capacitor.

6. The electronic module according to claim 1, further comprising a second semiconductor device including a ground terminal electrically connected to the ground line,
wherein the ground line includes a third ground via,
wherein the ground terminal is electrically connected to the ground pattern via the third ground via, and
wherein a center-to-center distance between the first ground via and the second ground via, viewed in the direction perpendicular to the first main surface, is smaller than each of a center-to-center distance between the first ground via and the third ground via, and a center-to-center distance between the second ground via and the third ground via.

7. The electronic module according to claim 6, wherein the second semiconductor device is a power supply device configured to supply electric power to the first semiconductor device.

8. The electronic module according to claim 1, further comprising an electric component configured to electrically connect the first power-supply line and the second power-supply line.

9. The electronic module according to claim 8, wherein the electric component is a low-pass-filer component.

10. The electronic module according to claim 9, wherein the electric component is a ferrite bead.

11. An electronic apparatus comprising:
a housing; and
the electronic module according to claim 1 and disposed in the housing.

* * * * *